United States Patent

Dias

[15] 3,696,479

[45] Oct. 10, 1972

[54] METHOD OF MAKING A PIEZOELECTRIC TRANSDUCER

[72] Inventor: Fleming Dias, Palo Alto, Calif.

[73] Assignee: Zenith Radio Corporation, Chicago, Ill.

[22] Filed: Oct. 22, 1970

[21] Appl. No.: 82,920

[52] U.S. Cl. ....................29/25.35, 29/595, 29/626, 174/68.5, 117/212, 29/530

[51] Int. Cl. ....................B01j 07/00, H04r 07/00

[58] Field of Search....317/10 A; 29/625, 626, 25.35, 29/595; 174/68.5

[56] References Cited

UNITED STATES PATENTS

| | | | |
|---|---|---|---|
| 2,474,988 | 7/1949 | Sargrove | 29/625 UX |
| 2,864,156 | 12/1958 | Cardy | 29/625 |
| 2,988,721 | 6/1961 | Louis | 29/625 UX |
| 3,029,495 | 4/1962 | Doctor | 29/627 UX |
| 3,314,128 | 4/1967 | Schultze | 29/626 |
| 3,374,110 | 3/1968 | Miller | 29/626 UX |

*Primary Examiner*—John F. Campbell
*Assistant Examiner*—Robert W. Church
*Attorney*—Francis W. Crotty

[57] ABSTRACT

For connecting external leads to miniature solid-state devices of the type wherein an electric circuit element is photoetched, printed or otherwise bonded upon a substrate surface, lands are embedded in the substrate and exposed to the circuit supporting surface of the substrate. The lands provide a surface large enough to enable the circuit elements and external leads to be individually connected to separated regions of the exposed portion or portions of the lands.

9 Claims, 10 Drawing Figures

Inventor
Fleming Dias
By Francis W. Crotty
Attorney

METHOD OF MAKING A PIEZOELECTRIC TRANSDUCER

BACKGROUND OF THE INVENTION

The present invention pertains to methods and structures for connecting external leads to miniature electric circuit elements.

A specific example of the type of circuit element referred to is a surface wave device or "SWIF" such as that disclosed in U.S. Pat. No. 3,446,975. The conductive elements of such devices are usually formed by the vacuum deposition of metallic alloys upon a substrate, the deposited metal being subsequently photoetched to form a pattern of metal of the desired configuration. The dimensions of the circuit elements with which the present invention is concerned are very minute and are usually measured in terms of microns. These circuit elements must be connected to external leads to conduct electric signals to or from the elements. Because of the delicate construction of the circuit elements, it is frequently difficult to connect external leads with an adequate degree of electrical and mechanical integrity.

The necessary bond between the external lead and circuit element must not only be adequate from the electrical standpoint but must also in many instances have sufficient mechanical strength to enable the external lead to function as a mechanical support for the device to which it is connected. Accordingly, it is a primary object of the present invention to provide a connection, between an external lead and a miniature circuit element, that possesses a relatively high degree of mechanical strength while at the same time providing good electrical contact.

In producing devices of this type for laboratory use, one conventional technique is to build up "landing pads" on the circuit element by vacuum deposition. This technique, however, does not lend itself to large scale production from the standpoint of manufacturing economy. Another object of the invention, therefore, is to provide connecting means, in accordance with the foregoing object, which are adapted for large scale or mass production.

SUMMARY OF THE INVENTION

In accordance with the present invention, an electrically conductive and mechanically connective land is formed on a miniature circuit element substrate. To that end, an indentation is formed in the surface of the substrate at the desired location of the land. The indentation is filled with a metallic alloy paste that is then dried in order to reduce the paste to a solidified alloy. Finally, the substrate surface, together with an exposed portion of the alloy, is lapped and polished to form a smooth continuous surface, the exposed portion of the alloy being flush and coplanar with the polished substrate surface.

In terms of structure, a solid-state device having an electric circuit element mounted upon a surface of a miniature substrate includes means for connecting an external lead to the circuit element. That connecting means takes the form of a land of an electrically conductive material embedded in the substrate and having an exposed portion at the surface of the substrate. The circuit element has a connecting portion overlying and bonded to a minor region of the exposed portion of the land, while an external lead is electrically and mechanically connected to another region of the land.

BRIEF DESCRIPTION OF THE DRAWINGS

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

DESCRIPTION OF THE PREFERRED EMBODIMENT

Figures 1, 2, 3, 4, 5, 6, 7, 8, 10:
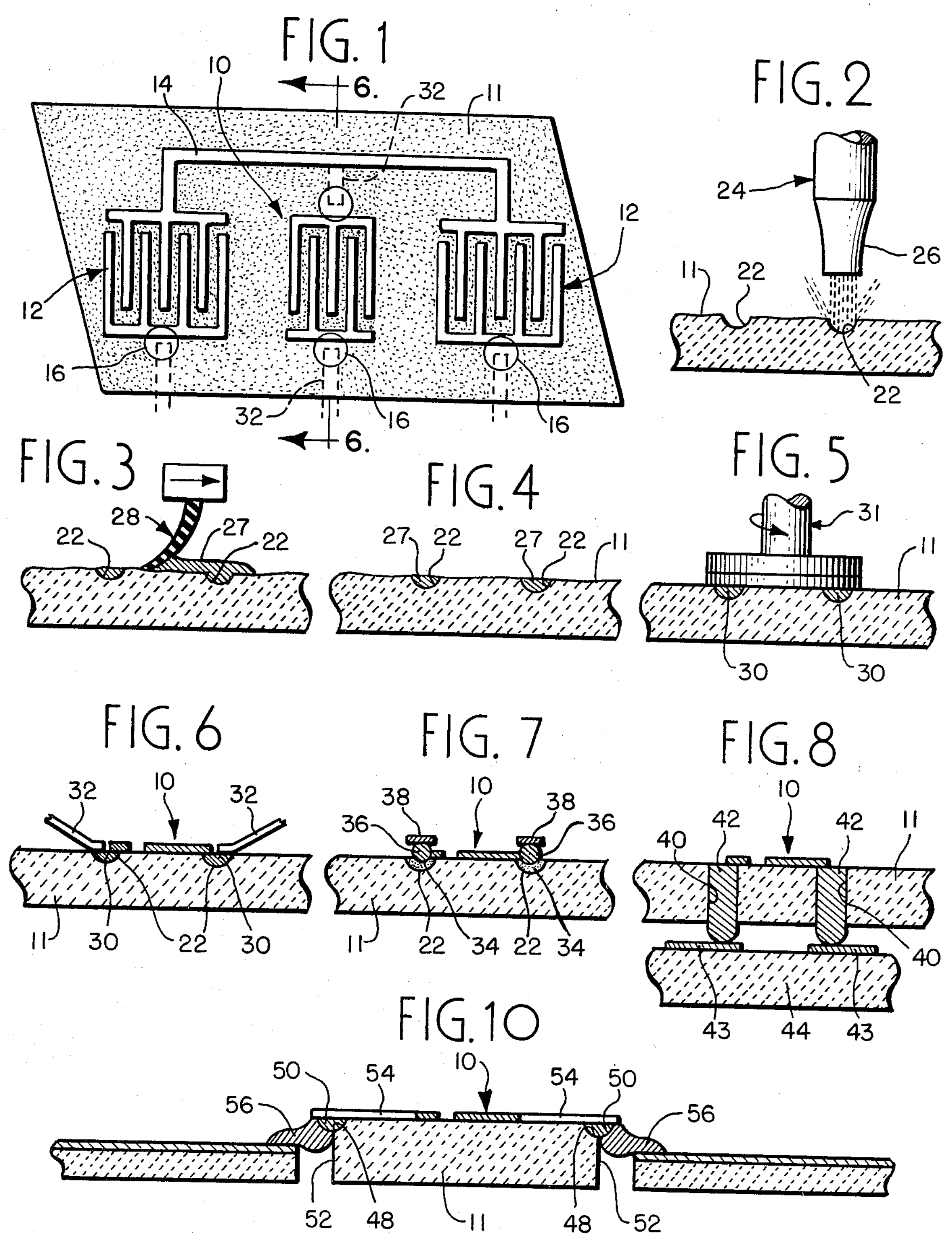
FIG. 1 is a plan view of a surface-wave device.
FIGS. 2 through 5, inclusive, schematically show successive steps in the formation of portions of a surface-wave device like that in FIG. 1.
FIG. 6 is a fragmentary cross-sectional view, taken along the line 6—6 in FIG. 1, of one version of such a device.
FIG. 7 is a fragmentary cross-sectional view of another version.
FIG. 8 is a fragmentary cross-sectional view of still another embodiment.
FIG. 10 is a fragmentary cross-sectional view of still another embodiment of the invention.

FIG. 1, illustrating one form of device to which the present invention is specifically applicable, depicts a surface-wave device or "SWIF." As now well-known, an input signal applied across an input transducer 10 affixed to a piezoelectric medium or substrate 11 produces acoustic surface waves that travel outwardly from that transducer. In the version shown, those waves travel both to the right and left so as to intercept output transducers 12 affixed to the same medium. Each of transducers 10 and 12 in this case is composed of an interleaved pair of conductive combs formed on substrate 11 by a conventional photoetching technique. Similarly, a lead 14, that connects one side of both output transducers 12, is formed at the same time by the same technique.

Substrate 11 is typically a thin slice of a piezoelectric material such as PZT or lithium niobate. The thickness of the metal layers that form the combs and other elements may be only 2,000 A or less. The longer dimension of substrate 11 as viewed in FIG. 1 may, for example, be of the order of one quarter of an inch. Further details of the construction and operation of devices such as those shown in FIG. 1 may be had by reference to the aforementioned United States Patent.

It is necessary to connect external signal sources and loads even to such minute circuit elements as transducers 10 and 12. Because of the delicate construction and small physical dimensions of the combs, however, it is undesirable in most instances to attempt to solder or otherwise bond an external lead directly to a comb element itself. Further, devices of this general type frequently rely upon the external leads for mechanical support; hence, it is desirable that the connection between the circuit element and the external lead not only be sound electrically but also that it possess sufficient mechanical strength to provide substantial structural support.

Accordingly, FIGS. 2 through 5 illustrate the sequential steps in one method for forming such a connection at the points indicated by the numeral 16 in FIG. 1. Referring first to FIG. 2, substrate 11 is subjected to a high-pressure jet of abrasive particles to form indentations 22 in one surface of the substrate. The particles are projected by conventional apparatus through a tube 24 and out of a nozzle 26 that determines the configuration of each indentation. Alternatively, indentations 22 may be cut by use of a collimated laser beam. As here exemplified, substrate 11 may have a thickness of 35 mils and indentations 22 are formed to a depth of about 12 mils, or approximately one-third the thickness of the substrate slab.

Before circuit elements, such as transducers 10 and 12 of FIG. 1 are formed, the substrate is lapped and polished so as to exhibit a very smooth surface. However, indentations 22 may be made in slab 11 when the surface of the latter is still in a rough or unfinished condition. The indentations are located where the desired connections 16 are subsequently to be made.

After indentations 22 have been formed and their areas thoroughly cleaned as by subjecting slab 11 to an ultrasonic cleaner, the slab surface in their vicinity is coated with a so-called "thick film" paste 27 of a metallic alloy, such as a palladium-silver or palladium-gold composition. Suitable pastes for this purpose are commercially available, as for example that manufactured and sold by E. I. DuPont de Nemours as DuPont Type 8151. The paste layer then is wiped by a squeegee 28 moved as indicated in FIG. 3 to remove excess paste from the substrate surface and at the same time to completely fill and pack indentations 22 with the paste. After the surface has been thoroughly squeegeed, the surface portion around the indentations is cleaned with a solvent for the paste.

The paste is then heated and fired to reduce the paste to a solidified alloy. This may be accomplished for palladium-silver by first heating the substrate and paste to dry the paste at 100° C. for approximately 10 minutes and then baking the structure in a furnace at 760° C. for a period of time to reduce the paste to its alloy constituents. Alternatively, the paste may be fired by exposing it to laser beam pulses.

If desired, after the paste has solidified into the alloy, the slab may be dipped into a bath of molten solder which will adhere to the exposed alloy surface but not to the substrate. However, it is usually found that the exposed surface of the alloy is insufficiently smooth. Also as previously noted, the surface of substrate 11 may at this time still be unfinished as depicted in FIG. 4.

Accordingly, the preferable final step in the formation of what constitutes conductive lands 30 is illustrated in FIG. 5. In this step, the substrate surface and the exposed land surfaces are lapped and polished to their final finished state by conventional lapping and polishing apparatus 31. The lands thus are rendered flush and coplanar with the substrate surface. Optimum operation of SWIF devices, such as that illustrated in FIG. 1, requires a smooth substrate surface having irregularities of less than 10 microns.

After the formation of lands 30 is thus completed, the substrate is poled, in a manner known as such, by placing electrodes on opposite surfaces of the substrate and applying voltage to the electrodes to establish a field strength, for the exemplary material and dimensions, of approximately 75 volts per mil through the substrate for a period of about 10 minutes. Because of the fact that indentations 22 are filled with metal alloy, care must be taken during the poling operation to hold down the poling voltage in accordance with the reduced effective thickness of the substrate at those points. In the case of a SWIF, such as that shown in FIG. 1, it may be found preferable to restrict or shape the poling electrodes so that they cover only those regions where the teeth of combs 10 and 12 subsequently will be located.

After poling, the poling electrodes are stripped from the slab and its active surface, together with the exposed land surfaces, is coated with a layer of aluminum or copper to an overall thickness of about 2,000 A. In some cases, this coating step is performed prior to poling and the aluminum or copper coating is employed as one of the poling electrodes.

The aluminum or copper coating is then coated with a layer of photoresist material of a type conventionally used in photoetching. Using standard techniques, the combs and/or other circuit elements are then photoetched, with those portions of the combs or circuit elements which are to be connected to external leads slightly overlapping the appropriate land or lands, and leaving the major portion of the land surface exposed. It is, as indicated in FIG. 6, these exposed surfaces of lands 30 to which external leads 32 later are soldered or otherwise bonded. FIG. 6, therefore, depicts a SWIF like that in FIG. 1 having lands 30 formed by the process illustrated in FIGS. 2 through 5 and provided with external connections or leads 32.

A number of alternative structures are possible embodying generally the same principles. In the formation of connecting lands in the FIG. 7 embodiment, for instance, indentations 22 are formed in slab 11 in the same manner as previously described. After the indentations are formed, the surface of the substrate is lapped and polished. A mask, having holes matching the indentations, is then placed over the polished substrate surface and an epoxy glue 34 is applied to the indentations through the mask. Pre-formed metal balls 36 are thereafter positioned in the indentations and adhesively bonded by the epoxy to the substrate. Balls 36 may be mounted in the indentations by any of several techniques as, for example, by placing a second mask over the surface, after the glue mask has been removed, and placing a large number of balls on the mask surface and vibrating the assembly to permit the balls to drop randomly through the mask openings into the glue-filled indentations. The epoxy is then set by heating the assembly to the curing temperature of the epoxy, a process which is somewhat less time-consuming then the reduction of the metallic alloy paste in the previously described embodiment.

After the adhesive has been cured, the substrate is poled and the circuit elements are photoetched in place as described above. External connections 38 may be bonded to the top portion of the balls 36, while the photoetched circuit element 10 contacts the balls only at the portion thereof that is closely adjacent to the substrate surface.

In a further modification as shown in FIG. 8, indentations 22 are extended to constitute bores 40 which pass completely through substrate 11. Bores 40 are packed with a metallic paste of the type employed in the embodiment of FIGS. 2 through 5 with the paste protruding below the lower surface of the substrate. The paste is then reduced to a metallic alloy by heating and drying, as described above, in order to form metal plugs 42. The lapping and polishing step of FIG. 5 is performed on the top surface of the substrate, and circuit element 10 subsequently is mounted on that surface. The portions of plugs 42 projecting below the lower surface of the substrate 11 enable the completed device to be mounted on and electrically connected to connecting leads 43 on a printed circuit board designated generally 44.

Figure 9:
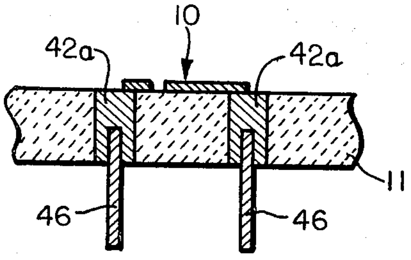
FIG. 9 is a fragmentary cross-sectional view of yet a further embodiment.

In FIG. 9, the same technique described in connection with FIG. 8 is employed, with the exception that, instead of forming projecting portions on the plugs at the lower substrate surface, pins 46 are embedded in metallic paste 42*a* before the heating and drying step so as to become permanently embedded in the plugs when the paste solidifies. Such pins, of course, are readily connectible into associated structure.

Still another embodiment is shown in FIG. 10. In this version, indentations 48 are formed in the corner edges between the top and side surfaces of substrate 11. Preferably, an excess of paste is employed so that the completed lands 50 project outwardly beyond the side surfaces 52 of substrate 11. After the paste is dried, the top surface of the substrate is lapped and polished as in the embodiment of FIGS. 2 though 5 to achieve a perfectly flat top surface. In addition to forming circuit element 10, a connecting strip 54 is photoetched to connect the circuit element to completed lands 50. This arrangement enables the lands to be spaced from the circuit element to minimize the possibility of damaging the circuit element while making the external connections 56 to lands 50.

A variety of different structural forms have been explained and illustrated. Whichever form is chosen for a particular application, it has been shown that a connection, between an external lead and a miniature circuit element, is formed that possesses a relatively high degree of mechanical strength while at the same time providing good electrical contact. Moreover, the formation of the connecting means is adaptable for mass production techniques utilizing currently available equipment.

While particular embodiments of the present invention have been shown and described, it is apparent that changes and modifications may be made therein without departing from the invention in its broader aspects. The aim of the appended claims, therefore, is to cover all such changes and modifications as fall within the true spirit and scope of the invention.

I claim;

1. In a method of making a miniature surface wave filter device or the like having a plurality of electroacoustic transducers, the steps comprising:

providing a relatively thin substrate composed of a piezoelectric material;

forming an electrically conductive and mechanically connective land on said substrate for connecting a lead to said device comprising the steps of:

forming an indentation in a surface of said substrate at the desired location of said land, filling said indentation with a metallic alloy paste, drying said paste to reduce the paste to a solidified alloy, and p1 lapping and polishing a portion of said substrate surface together with the exposed portion of said alloy to form a continuous surface on said substrate of sufficient smoothness to propagate surface waves without substantial scattering thereof and with the exposed portion of said alloy flush and coplanar with the substrate surface; and depositing a periodic pattern of electrically conductive elements on said polished portion of said substrate and extending on to a fractional part of said exposed portion of said alloy to produce an electro-acoustic transducer for generating or receiving surface waves.

2. The method as defined in claim 1 wherein said indentation is formed on only that surface of said substrate which includes said polished portion.

3. The method as defined in claim 1 wherein said indentation extends entirely through said substrate from one surface to the opposed surface and further comprising the step of forming said solidified alloy with a portion thereof projecting outwardly from said opposed surface of said substrate.

4. The method as defined in claim 3 wherein said projecting portion is formed by overfilling said indentation with said paste.

5. The method as defined in claim 3 wherein said projecting portion is formed by embedding a pin in said paste prior to said drying step.

6. The method as defined in claim 1 wherein said indentation is formed by directing a high speed stream of abrasive particles against one surface of said substrate.

7. The method as defined in claim 1 wherein the step of filling said indentation comprises the steps of:

coating the substrate surface with a layer of said paste;

squeegeeing the coated surface to fill the indentations and remove the excess paste from said surface;

and cleaning the surface of the substrate adjacent to said indentation.

8. The method as defined in claim 1 wherein said paste is a palladium-silver alloy and said drying step comprises the sequential steps of:

drying said paste for approximately 10 minutes at 100° C.;

and subsequently baking said paste at a temperature in excess of 700° C. until said paste is reduced to palladium-silver alloy.

9. The method as defined in claim 7 which further comprises the step of dipping said substrate into a bath of molten solder after said drying step.

* * * * *